(12) United States Patent
Broome

(10) Patent No.: US 6,384,653 B1
(45) Date of Patent: May 7, 2002

(54) LINEARLY CONTROLLED CMOS PHASE INTERPOLATOR

(75) Inventor: Steve M. Broome, Apex, NC (US)

(73) Assignee: Cadence Design Systems, San Jose, CA (US)

(*) Notice: Subject to any disclaimer, the term of this patent is extended or adjusted under 35 U.S.C. 154(b) by 0 days.

(21) Appl. No.: 09/644,188

(22) Filed: Aug. 22, 2000

(51) Int. Cl.$^7$ ................................................ H03H 11/16
(52) U.S. Cl. ........................ 327/247; 327/131; 327/134
(58) Field of Search ................................ 327/100, 131, 327/134, 140, 247

(56) References Cited

U.S. PATENT DOCUMENTS 4,962,344 A  * 10/1990  Bohrer .......................... 327/134
5,367,212 A  * 11/1994  Rabii ........................... 327/133
5,717,350 A  *  2/1998  Bohrer .......................... 327/100

* cited by examiner

*Primary Examiner*—Kenneth B. Wells
(74) *Attorney, Agent, or Firm*—John F. Schipper

(57) ABSTRACT

Method and system for providing a signal with a controllable zero crossing time value. The system provides first and second two-sided triangular wave signals, identical but shifted by a selected fraction f·T of a period T of either triangular signal, and forms a weighted sum of the signals, weighted by A and 1−A, respectively, with $0 \leq A \leq 1$. In each of two time regions within a period T, a zero crossing time of the sum varies linearly with choice of the value A.

15 Claims, 4 Drawing Sheets

LINEARLY CONTROLLED CMOS PHASE INTERPOLATOR

FIELD OF THE INVENTION

This invention relates to control of a CMOS phase interpolator.

BACKGROUND OF THE INVENTION

Accurate control of a zero crossing point of a signal has several useful applications, including phase interpolation for a varying signal. What is needed is a phase interpolation system in which the zero crossing point varies linearly with a controllable parameter that can be varied over a finite parameter range. Preferably, the range of the zero crossing parameter should be flexible so that the range can be increased or decreased according to the particular circumstances.

SUMMARY OF THE INVENTION

These needs are met by the invention, which provides a CMOS phase interpolator in which a linear change in a parameter in the input control signal produces a linear change in phase of the output waveform relative to the input waveform. The interpolation approach works on a principle of weighted addition of two two-sided triangle waves that have a selected phase difference. The weighted sum of two triangle waves produces an output signal having a zero crossing point that ranges over the selected phase difference. Each of two spaced apart segments within the period of the triangular waves provides a zero crossing point, and the location and temporal length of each segment can be varied by choice of a relative phase of the two triangular waves.

DESCRIPTION OF BEST MODES OF THE INVENTION

Figure 1A:
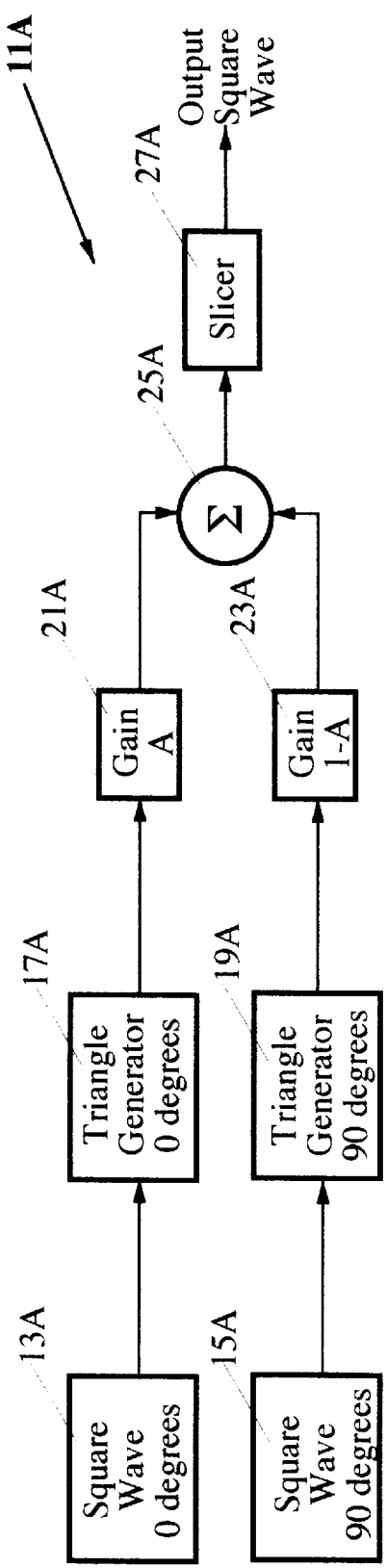
FIG. 1 is a block diagram of an ideal interpolator.

FIG. 1A illustrates, in block diagram form, a first approach to an ideal interpolator 11A. Output signals from square wave generators, 13A and 15A, with relative phases of 0° and 90°, respectively, are received by respective triangle generators 17A and 19A. Output triangular waves from the triangle generators, 17A and 19A, are multiplied by the respective weight coefficients or gains A and 1−A ($0 \leq A \leq 1$), in multiplier modules 21A and 23A. The weighted triangular wave signals issued by the multiplier modules, 21A and 23A, are summed in a summer 25A, and the sum is further processed in a slicer 27A to provide a square wave output signal.

Figure 1B:
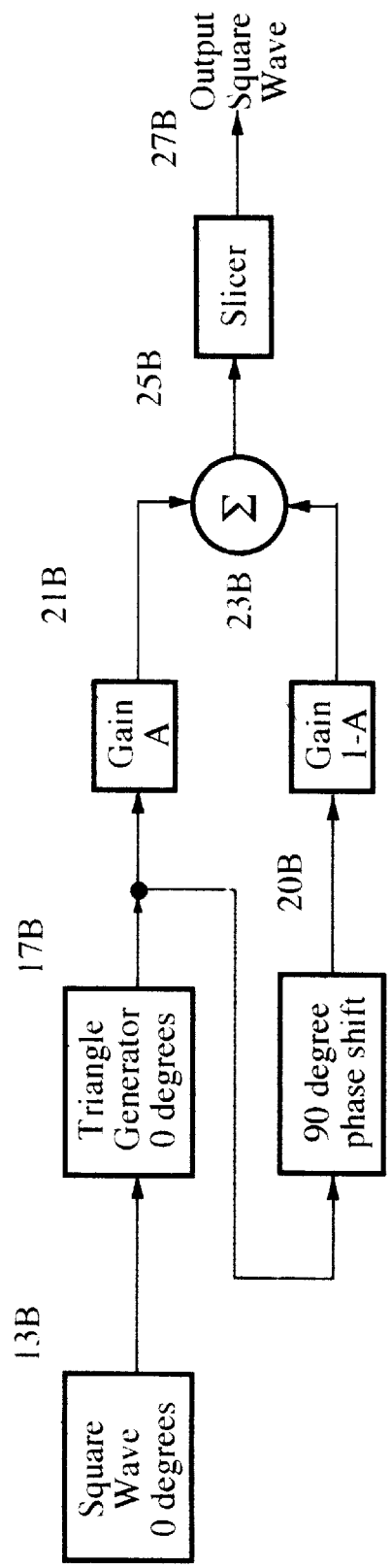

FIG. 1B illustrates a second approach to an ideal interpolator 1B, in which the square wave generator 15A and triangular wave generator 19A with 90° relative phases are deleted and replaced by a 90° signal phase shift module 20B, with all other components in FIG. 1B being substantially the same as the corresponding components in FIG. 1A. The amplitude of the output signal of each of the summer 25A and the summer 25B has a zero crossing point that varies linearly in time with variation of the gain parameter or weight A, as discussed in the following.

Figure 2A:
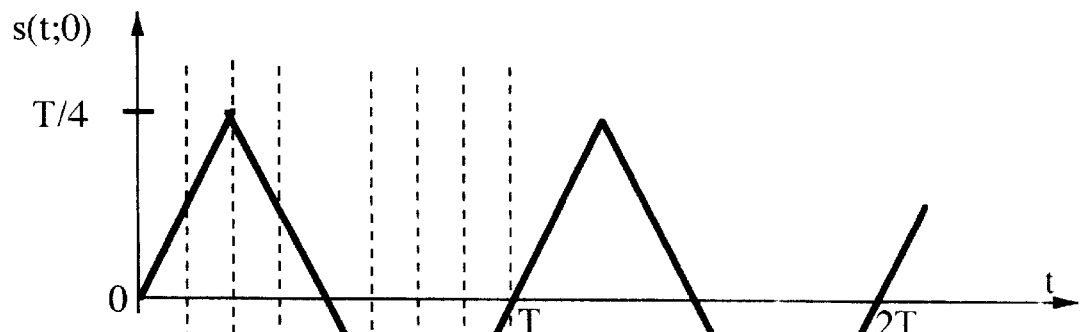
FIGS. 2A, 2B, 2C and 2D are graphical views of first, second, third and fourth triangle waves, with the second, third and fourth waves having phases of 45°, 90° and 135° relative to the first wave.
Figure 2B:
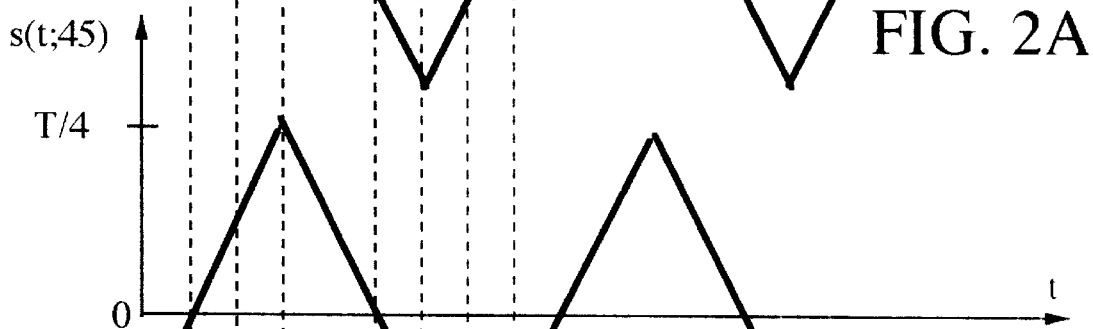

FIGS. 2A and 2B are graphical views of two-sided triangular waves, s(t;0) and s(t;45), respectively, each with a period T, where s(t;0) leads s(t;45) by a 45° relative phase so that $$s(t;45)=s(t-T/8;0). \quad (1)$$

From a comparison of the graphs in FIGS. 2A and 2B, one verifies that the weighted sum signal $$S(t;0;45;A)=A \cdot s(t;0)+(1-A) \cdot s(t;45) \quad (2)$$

has both positive and negative signums only in the time intervals TI(1) ($0 \leq t \leq t/8$) and TI(2) ($T/2 \leq t \leq 5T/8$), and that the weighted sum signal has at most one zero crossing point in each of these time intervals. In the time intervals TI(1) and TI(2), the weighted sum signal becomes $$S(t; 0; 45; A) = A \cdot t + (1-A) \cdot (t - T/8) \quad (3)$$
$$= t - (1-A)T/8 \quad (0 \leq t \leq T/8),$$

$$S(t; 0; 45; A) = A \cdot ((T/2 - t) + (1-A) \cdot ((5T/8 - t) \quad (4)$$
$$= (5-A)T/8 - t \quad (T/2 \leq t \leq 5T/8).$$

Figure 3:
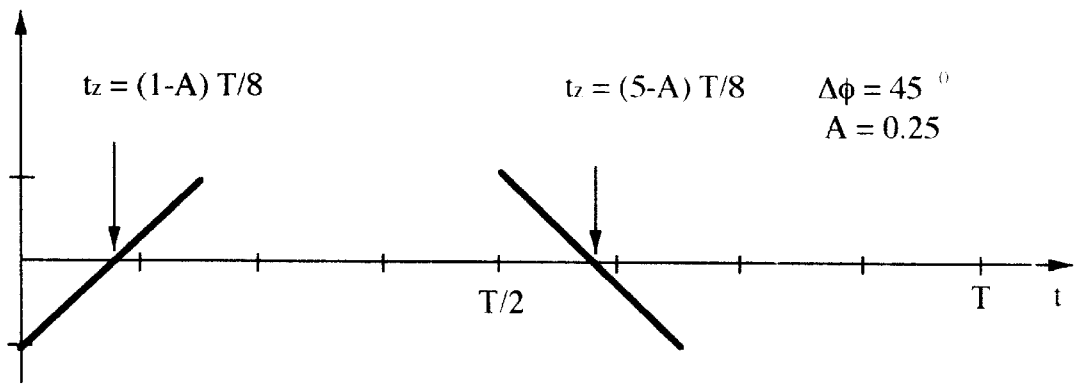
FIGS. 3, 4 and 5 are graphical views of segments of weighted sum signals S(t;0;45), S(t;0;90) and S(t;0;135), respectively, where a zero crossing occurs.

These two segments of the weighted sum signal S(t;0;45) are shown graphically in FIG. 3 and have the respective zero crossing values $$t=t_z(1)=(1-A) \cdot T/8 \epsilon TI(1), \quad (5)$$

$$t=t_z(2)=(5-A) \cdot T/8 \epsilon TI(2). \quad (6)$$

The zero crossing value $t_z(i)$ (i=1, 2) varies linearly with the gain parameter A from one end of the time interval TI(i) to the other end, as A varies from 0 to 1.

Figure 2C:
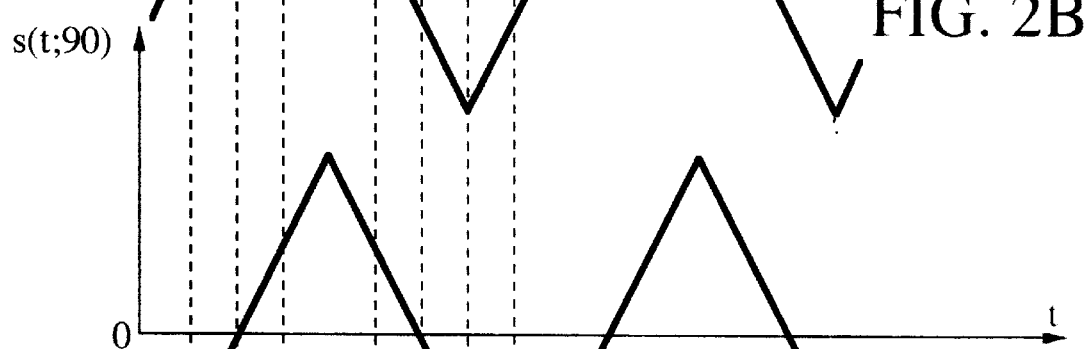

A weighted sum of the triangular waves s(t;0) and s(t;90), shown in FIGS. 2A and 2C, $$S(t;0;90;A)=A \cdot s(t;0)+(1-A) \cdot s(t;90), \quad (7)$$

can also be formed, for waves that differ by a relative phase of 90°. From a comparison of the graphs in FIGS. 2A and 2C, one verifies that the weighted sum signal S(t;0;90;A) has both positive and negative signums only in the time intervals TI(3) ($0 \leq t \leq T/4$) and TI(4) ($T/2 \leq t \leq 3T/4$), and that the weighted sum signal has at most one zero crossing point in each of these time intervals. In the time intervals TI(3) and TI(4), the weighted sum signal becomes $$S(t; 0; 90; A) = A \cdot t + (1-A) \cdot (t - T/4) \quad (8)$$
$$= t - (1-A) \cdot T/4 \quad (0 \leq t \leq T/4),$$

$$S(t; 0; 90; A) = A \cdot ((T/2 - t) + (1-A) \cdot ((3T/4 - t) \quad (9)$$
$$= (3-A)T/4 - t \quad (T/2 \leq t \leq 3T/4).$$

Figure 4:
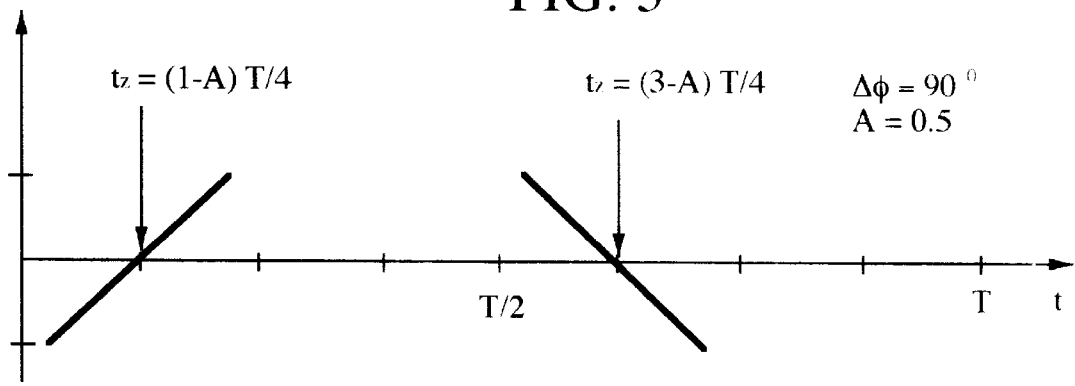

These two segments of the weighted sum signal S(t;0;90;A) are shown graphically in FIG. 4 and have the respective zero crossing values $$t=t_z(3)=(1-A) \cdot T/4 \epsilon TI(3), \quad (10)$$

$$t=t_z(4)=(3-A) \cdot T/4 \epsilon TI(4). \quad (11)$$

The zero crossing value $t_z(i)$ (i=3, 4) varies linearly with the gain parameter A from one end of the time interval TI(i) to the other end, as A varies from 0 to 1.

Figure 2D:
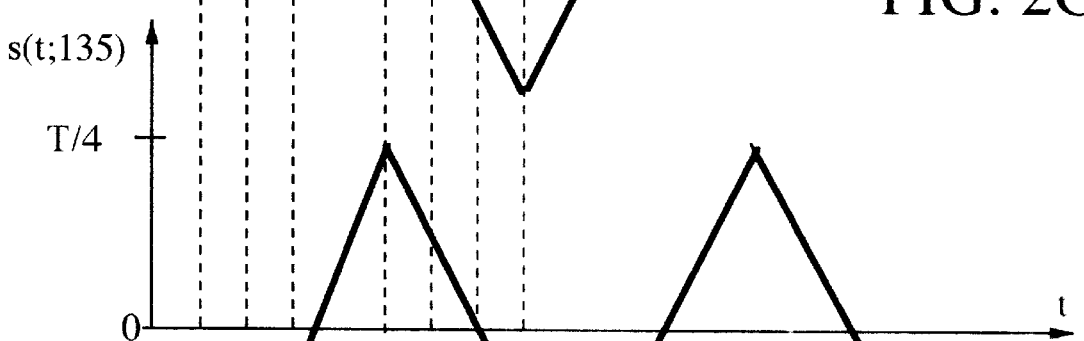

A weighted sum of the triangular waves s(t;0) and 2(t, 135), shown in FIGS. 2A and 2D, $$s(t;0;135;A)=A \cdot s(t;0)+(1-A) \cdot s(t;135), \qquad (12)$$

can also be formed, for waves that differ by a relative phase of 135°. From a comparison of the graphs in FIGS. 2A and 2D, one verifies that the weighted sum signal S(t;0;135) has both positive and negative signums only in the time intervals TI(5) ($0 \leq t \leq 3T/8$) and TI(6) ($T/2 \leq t \leq 7T/8$). Further analysis reveals that only for times t within the sub-intervals TI'(5) ($T/8 \leq t \leq T/4$) and TI'(6) ($5T/8 \leq t \leq 3T/4$) does the zero crossing value vary linearly with the gain parameter A. Within the time intervals TI'(5) and TI'(6), the weighted sum signal becomes $$\begin{aligned} S(t; 0; 135; A) &= A \cdot t + (1-A) \cdot (t-T/4) & (13) \\ &= t - (1-A) \cdot T/4 & (T/8 \leq t \leq T/4), \end{aligned}$$

$$\begin{aligned} S(t; 0; 135; A) &= A \cdot ((T/2-t) + (1-A) \cdot ((7T/8-t) & (14) \\ &= (7-3A)T/8 - t & (5T/8 \leq t \leq 3T/4). \end{aligned}$$

Figure 5:
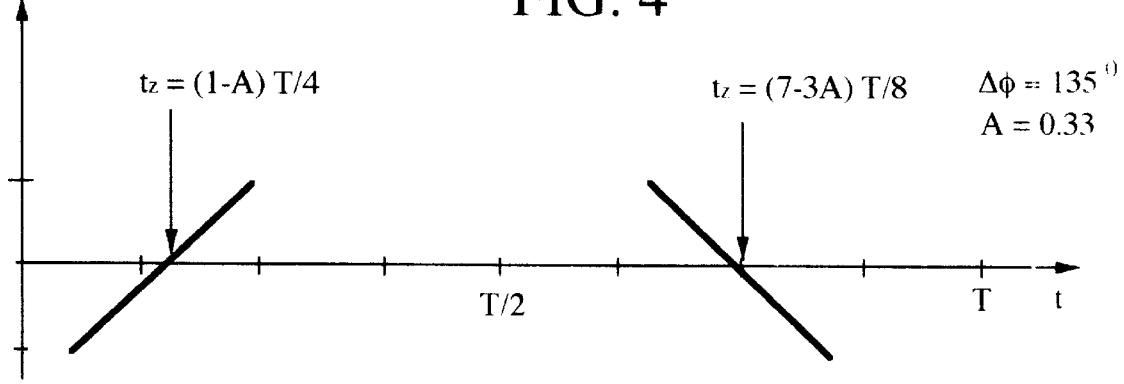

These two segments of the weighted sum signal S(t;0;135) are shown graphically in FIG. 5 and have the respective zero crossing values $$t=t_z(5)=(1-A) \cdot T/4 \epsilon TI'(5), \qquad (15)$$

$$t=t_z(6)=(7-3A) \cdot T/8 \epsilon TI'(6). \qquad (16)$$

The zero crossing value $t_z(i)$ (i=5, 6) varies linearly with the gain parameter A from one end of the time interval TI'(i) to the other end, as A varies from 0 to 1.

The particular phase differences $\Delta\phi=45°$, 90° and 135°, shown in FIGS. 3, 4 and 5 were chosen for illustration purposes only. Any selected phase difference $\Delta\phi$ in the range $0<\Delta\phi<180°$ could be used here. Each choice of a pair of values ($\Delta\phi$,A) will produce a pair of zero crossing values.

Figure 6:
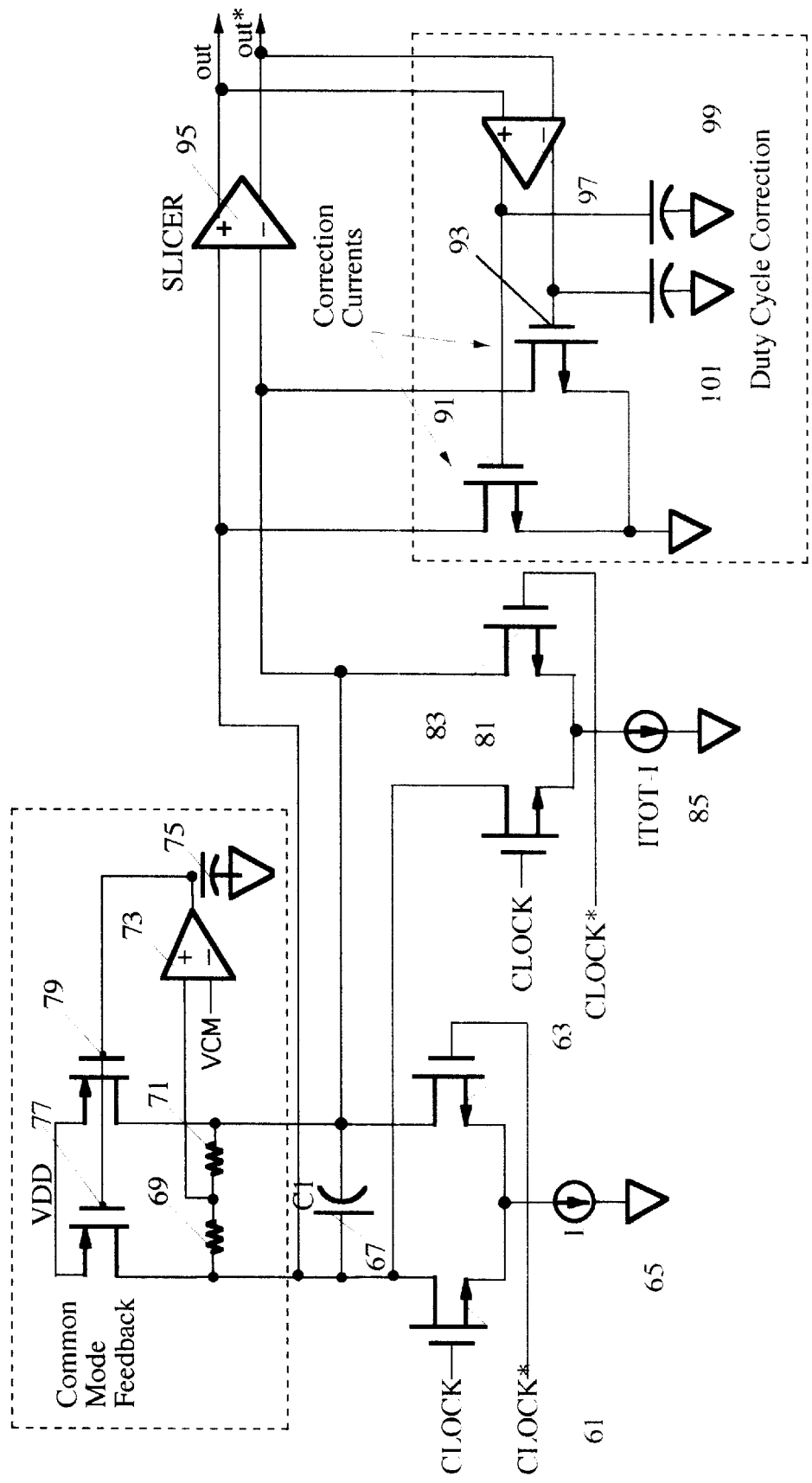
FIG. 6 is a schematic view of a phase interpolator circuit suitable for practicing the invention.

FIG. 6 illustrates a practical implementation of the interpolator circuit indicated in block diagram form in FIG. 1. Two complementary clock signals, CLK(t) and CLK(t)*, are received at the gates of first and second substantially identical CMOS transistors, 61 and 63, whose drain terminals are both connected through a current generator 65 to ground. The source terminals of the first and second transistors, 61 and 63, are connected to each other through a capacitor 67 and through first and second resistors, 69 and 71, in series. An intermediate point of the first and second resistors, 69 and 71, is connected to the positive input terminal of a differential amplifier 73, whose negative input terminal receives a selected, substantially constant voltage input signal VCM. The output terminal of the diff amp 73 is connected to ground across a second capacitor 75 and is connected to the gates of third and fourth substantially identical CMOS transistors, 77 and 79. The source terminals of the third and fourth transistors, 77 and 79, are connected to a common voltage source VDD, and the drain terminals of these two transistors are connected to the source terminals of the first and second transistors, 61 and 63, to provide a common mode feedback loop for the diff amp 73.

The source terminals of the first and second transistors, 61 and 63, are connected to source terminals of fifth and sixth substantially identical transistors, 81 and 83, respectively, whose gates receive two complementary second clock signals, CLKQ(t) and CLKQ(t)*, respectively, where one of the signals CLKQ(t) and CLKQ(t)* is identical to but shifted in time relative to the signal CLK(t). The drain terminals of the fifth and sixth transistors, 81 and 83, are connected through a second current generator 85 to ground.

The source terminals of the first and second transistors, 61 and 63, are also connected to source terminals of seventh and eighth transistors, 91 and 93. The drain terminal of the seventh and eighth transistors are connected to ground. The source terminals of the seventh and eighth transistors, 91 and 93, are also connected to the positive and negative input terminals, respectively, of a slicer 95, whose two output terminals are connected to positive and negative input terminals of an amplifier 97. Two output terminals of the amplifier 97 are connected to the gates of the seventh and eighth transistors 91 and 93, and to ground across third and fourth capacitors, 99 and 101, respectively. A sub-circuit 103 including the seventh and eight transistors, 91 and 93, the amplifier 97 and the third and fourth capacitors, 99 and 101, serves as a duty cycle correction unit. Output signals from the slicer 95 provide complementary square waves, one of which appears at the slicer output terminal in FIGS. 1A and 1B.

What is claimed is:

1. A method of providing a signal with at least one controllable zero crossing time value, the method comprising:

providing a first time varying triangular wave train, having a selected period T, centered at zero amplitude and having a maximum amplitude value of A, where A is a selected number in the range $0 \leq A \leq 1$ and can be varied;

providing a second time varying triangular wave train, having the period T, shifted in phase from the first triangular wave train by a selected amount f·T, centered at zero amplitude and having a maximum amplitude of 1−A, where f is a selected fraction satisfying 0<f<0.5 and can be varied;

choosing the fraction value f so that a sum of the first and second triangular wave trains has at least one positive value and has at least one negative value, within a selected time interval that is determined by the choice of f; and choosing the amplitude value A so that the sum of the first and second triangular wave trains has the at least one zero crossing value at a selected time value t=$t_z$ in the range $0 \leq t_z \leq T$, where the time $t_z$ varies linearly with A within a selected time interval.

2. The method of claim 1, further comprising choosing said fraction f to be f=0.125, and selecting said zero crossing value in one of the time ranges $0 \leq t \leq T/8$ and $T/2 \leq t \leq 5T/8$.

3. The method of claim 1, further comprising choosing said fraction f to be f=0.25, and selecting said zero crossing value in one of the time ranges $0 \leq t \leq T/4$ and $T/2 \leq t \leq 3T/4$.

4. The method of claim 1, further comprising choosing said fraction f to be f=0.375, and selecting said zero crossing value in one of the time ranges $0 \leq t \leq 3T/8$ and $T/2 \leq t \leq 7T/8$.

5. The method of claim 4, further comprising selecting said zero crossing value in one of the time ranges $T/8 \leq t \leq T/4$ and $5T/8 \leq t \leq 3T/4$.

6. A system providing a signal with at least one controllable zero crossing time value, the system comprising:

a first signal source that provides a first time varying triangular wave train, having a selected period T, centered at zero amplitude and having a maximum amplitude value of A, where A is a selected number in the range $0 \leq A \leq 1$ and can be varied;

a second signal source that provides a second time varying triangular wave train, having the period T, shifted in phase from the first triangular wave train by a selected amount f·T, centered at zero amplitude and having a maximum amplitude of 1−A, where f is a selected fraction satisfying 0<f<0.5 and can be varied;

a signal summer that provides a sum of the first and second triangular wave trains at a selected sequence of time values; and amplitude choice means for choosing the amplitude value A and the fraction value f so that the sum of the first and second triangular wave trains has the at least one zero value crossing at a selected time value t=$t_z$ in the range 0≦$t_z$≦T, where the time $t_z$ varies linearly with A within a selected time interval.

7. The system of claim 6, wherein said fraction f is chosen to be f=0.125, and said zero crossing value is selected in one of the time ranges 0≦t≦T/8 and T/2≦t≦5T/8.

8. The system of claim 6, wherein said fraction f is chosen to be f=0.25, and said zero crossing value is selected in one of the time ranges 0≦t≦T/4 and T/2≦t≦3T/4.

9. The system of claim 6, wherein said fraction f is chosen to be f=0.375, and said zero crossing value is selected in one of the time ranges 0≦t≦3T/8 and T/2≦t≦7T/8.

10. The system of claim 9, wherein said zero crossing value is selected to be in one of the time ranges T/8≦t≦T/4 and 5T/8≦t≦3T/4.

11. A system providing a signal with at least one controllable zero crossing time value, the system comprising:

a triangle wave generator that provides a first triangle wave train having a selected period T and a second triangle wave train, identical to but shifted in time by a selected time f·T relative to the first triangle wave train, where f is a selected fraction (0<f<0.5) and can be varied;

a signal summer that receives the first and second triangle wave trains, multiplies the wave trains by A and by 1−A, respectively, to form modified first and second wave trains, and that forms a sum of the first and second modified wave trains, where A is a selected value in a range 0≦A≦1 and can be varied; and amplitude choice means for choosing the amplitude value A and the fraction value f so that the sum of the first and second modified wave trains has the at least one zero value crossing at a selected time value t=$t_z$ in the range 0≦$t_z$≦T, where the time $t_z$ varies linearly with A within a selected time interval.

12. The system of claim 11, wherein said fraction f is chosen to be f=0.125, and said zero crossing value is selected in one of the time ranges 0≦t≦T/8 and T/2≦t≦5T/8.

13. The system of claim 11, wherein said fraction f is chosen to be f=0.25, and said zero crossing value is selected in one of the time ranges 0≦t≦T/4 and T/2≦t≦3T/4.

14. The system of claim 11, wherein said fraction f is chosen to be f=0.375, and said zero crossing value is selected in one of the time ranges 0≦t≦3T/8 and T/2≦t≦7T/8.

15. The system of claim 14, wherein said zero crossing value is selected to be in one of the time ranges T/8≦t≦T/4 and 5T/8≦t≦3T/4.

* * * * *